United States Patent [19]
Banakis et al.

[11] Patent Number: 5,692,920
[45] Date of Patent: Dec. 2, 1997

[54] ZERO INSERTION FORCE ELECTRICAL CONNECTOR AND TERMINAL

[75] Inventors: Emanuel G. Banakis, Naperville, Ill.; Robert C. Brakenridge, Phoenix, Ariz.; Richard A. Hays, Montgomery, Ill.

[73] Assignee: Molex Incorporated, Lisle, Ill.

[21] Appl. No.: 572,557

[22] Filed: Dec. 14, 1995

[51] Int. Cl.⁶ .................................................. H01R 13/629
[52] U.S. Cl. .......................... 439/342; 439/259; 439/746; 439/876
[58] Field of Search .................. 439/342, 259–270, 439/876, 83, 746

[56] References Cited

U.S. PATENT DOCUMENTS

| | | | |
|---|---|---|---|
| 2,497,484 | 2/1950 | Wood | 439/746 |
| 3,883,207 | 5/1975 | Tomkiewicz | 439/746 |
| 4,343,530 | 8/1982 | Leger | 439/876 |
| 5,196,460 | 3/1993 | Emani | 439/746 |
| 5,443,591 | 8/1995 | Tsai | 439/342 |
| 5,489,218 | 2/1996 | McHugh | 439/342 |
| 5,551,883 | 9/1996 | Davis | 439/746 |
| 5,562,474 | 10/1996 | Lee | 439/342 |

*Primary Examiner*—Hien Vu
*Attorney, Agent, or Firm*—Charles S. Cohen

[57] ABSTRACT

A zero insertion force electrical connector including a connector housing having a top surface and a plurality of cavities in the top surface corresponding to an array of pin terminals. Each of the cavities includes a base wall spaced from the top surface and terminal retention openings in the base wall. A plurality of terminals are mounted in the cavities. Each of the terminals is a stamped and formed segment of flat and planar metal stock including a mounting portion substantially in the plane of the stock, a free end portion, a contact structure adjacent the free end portion and a spring arm portion between the mounting portion and the contact structure. The pin terminals are moved in the cavities between an unmated position wherein the pins are spaced from the contact structures in the cavities and a mated position wherein the pins are mated with the contact structures. The terminal mounting portion of each terminal is received in one of the terminal retention openings for securing the terminal in the cavity. The contact structure includes a pin engagement surface raised from the plane of the stock. The terminal retention opening has an enlarged portion permitting entry of the contact structure into the cavity through the base wall. The mounting portion has a projection extending out of the plane of the stock and substantially blocking the enlarged portion when the mounting portion is received in the terminal retention opening.

7 Claims, 2 Drawing Sheets

ZERO INSERTION FORCE ELECTRICAL CONNECTOR AND TERMINAL

FIELD OF THE INVENTION

The present invention relates to electrical connectors and more particularly to an improved zero insertion force electrical connector for high frequency pin grid array devices.

BACKGROUND OF THE INVENTION

A pin grid array (PGA) device such as a microprocessor may have many pin terminals, numbering in the hundreds. Electrical connectors are used to mount PGA devices on a printed circuit board and establish electrical connections between the pin terminals of the PGA device and conductors of the printed circuit board. A typical electrical connector permits the PGA device to be removed for repair or upgrade purposes. Another beneficial result is that the PGA device is not subjected to heat when the connector is soldered to a printed circuit board.

In some known electrical contact systems, when a pin terminal is inserted into a cavity of the connector, it contacts and resiliently deforms a mating terminal. As a result forces are required to mate and unmate such a contact system. Mating forces are not desirable in electrical connectors for devices such as PGA devices because the large number of contacts results in large cumulative forces that could damage some of the pins of the PGA device. When there is a need to eliminate mating forces, a connector known as a zero insertion force (ZIF) connector can be used.

A typical zero insertion force connector for PGA devices includes a lower housing with numerous cavities corresponding to the array of pin terminals of a PGA device. A resilient electrical terminal is mounted in each cavity. An upper housing includes numerous openings through which the pin terminals of the PGA device extend. The upper housing can be moved relative to the lower housing between a first free or unmated position and a second locked or fully mated position. In the free position, the PGA device can be placed with no contact insertion force upon the upper housing with the pin terminals extending through the upper housing and into regions in the cavities of the lower housing where they are spaced from the resilient terminals. The upper housing is then moved relative to the lower housing, causing the pin terminals to move into contact with the resilient terminals in the cavities.

U.S. Pat. No. 4,498,725 to Bright et al. and 4,750,891 to Egawa at FIGS. 5 and 7 disclose zero insertion force connectors with resilient terminals having contact structures in the form of a pair of spaced apart resilient opposed fingers between which a pin terminal may be received.

U.S. Pat. No. 3,315,212 to Peterson, U.S. Pat. No. 4,674,811 to Corwin, U.S. Pat. No. 4,750,891 to Egawa at FIGS. 8A and 8B and U.S. Pat. No. 4,887,974 to Ichimura et al. disclose zero insertion force connectors with terminals having free ends with contact structures and spring portions that flex in the same direction as the pin terminals move in order to provide a contact force.

U.S. Pat. No. 4,988,310 to Bright et al. discloses a zero insertion force connector having terminals with an upstanding beam, a cantilever beam portion extending laterally from the upstanding beam and a contact area upon the cantilever beam acting to cause torsional deflection of the cantilever beam in the mated condition.

U.S. Pat. No. 5,342,214 to Hsu discloses a zero insertion force connector having two upstanding terminal portions, one including a laterally extending guide portion 430 and a noninclined contact portion 43.

Pending U.S. patent application Ser. No. 08/367,566 filed on Jan. 3, 1995 discloses and claims a zero insertion force connector with flexible terminals each having a mounting portion, a leaf spring portion and a contact structure at a free end. The leaf spring portion flexes in a direction perpendicular to the direction of movement of the pin terminal relative to the flexible terminal, and the contact structure includes an inclined ramp surface generally disposed within the lateral bounds of the leaf spring portion.

The zero insertion force connector of said U.S. patent application Ser. No. 08/367,566 has advantages including small contact pitch or spacing, a simple sturdy shape and minimum contact plating requirements. However, in some applications it is desirable to reduce the inductance when used with PGA devices operating at very high speeds or frequencies.

Shortening the length of the terminal would reduce the inductance but could lead to other problems such as large contact mating forces or overstressing of the terminal beams. In addition, the terminals of that connector are inserted from the top of the connector housing and the terminal mounting force may need to be applied to the free end of the terminal and not directly to the mounting portion.

SUMMARY OF THE INVENTION

A primary object of the present invention is to provide an improved zero insertion force connector and terminal having low impedance and suited for use in high frequency applications. Another object is to provide a zero insertion force connector with a terminal having a small length between a mounting portion and a free end and having low contact mating force, low mechanical stress and substantial normal contact force when fully mated. Other objects are to provide a terminal for zero insertion force connectors that is loaded from the bottom of a housing with a loading force applied directly to the terminal mounting portion, and to provide a terminal having structure for preventing the wicking of solder through an enlarged mounting opening used to facilitate loading the terminal from the bottom of the housing.

In brief, in accordance with the invention, there is provided a zero insertion force electrical connector for use with a device having an array of pin terminals. The electrical connector includes a lower connector housing having a top surface and a plurality of cavities in the top surface corresponding to the array of pin terminals. Each of the cavities includes a base wall spaced from the top surface. A plurality of resilient terminals are mounted in the cavities.

Each of the terminals includes a mounting portion for securing the terminal in the base wall, a free end portion, a contact structure adjacent the free end portion and a spring arm portion between the base wall and the contact structure. The pin terminals are moved in the cavities in a first direction along a path of travel between an unmated position wherein the pins are spaced from the contact structures in the cavities and a mated position wherein the pins are fully mated with the contact structures. The contact structure includes a pin engagement surface at least partly inclined with respect to the path of travel. The spring arm portion of each of the terminals is a generally flat and planar leaf region oriented generally parallel to the first direction. The leaf region includes a first side edge at a side of the terminal where the pin first engages the contact structure and a second side edge extending from the mounting portion to the contact structure at the opposite side of the terminal. Notch means is provided in at least one of the side edges for increasing the flexibility of the leaf portion.

In brief, in accordance with another feature of the invention, there is provided a zero insertion force electrical connector including a connector housing having a top surface and a plurality of cavities in the top surface corresponding to an array of pin terminals. Each of the cavities includes a base wall spaced from the top surface and terminal retention openings in the base wall. A plurality of terminals are mounted in the cavities. Each of the terminals is a stamped and formed segment of flat and planar metal stock including a mounting portion substantially in the plane of the stock, a free end portion, a contact structure adjacent the free end portion and a spring arm portion between the mounting portion and the contact structure. The pin terminals are moved in the cavities between an unmated position wherein the pins are spaced from the contact structures in the cavities and a mated position wherein the pins are mated with the contact structures. The terminal mounting portion of each terminal is received in one of the terminal retention openings for securing the terminal in the cavity. The contact structure includes a pin engagement surface raised from the plane of the stock. The terminal retention opening has an enlarged portion permitting entry of the contact structure into the cavity through the base wall. The mounting portion has a projection extending out of the plane of the stock and substantially blocking the enlarged portion when the mounting portion is received in the terminal retention opening.

BRIEF DESCRIPTION OF THE DRAWING

The present invention together with the above and other objects and advantages may best be understood from the following detailed description of the preferred embodiment of the invention illustrated in the drawings, wherein.

DETAILED DESCRIPTION OF THE PREFERRED EMBODIMENT

Figure 1:
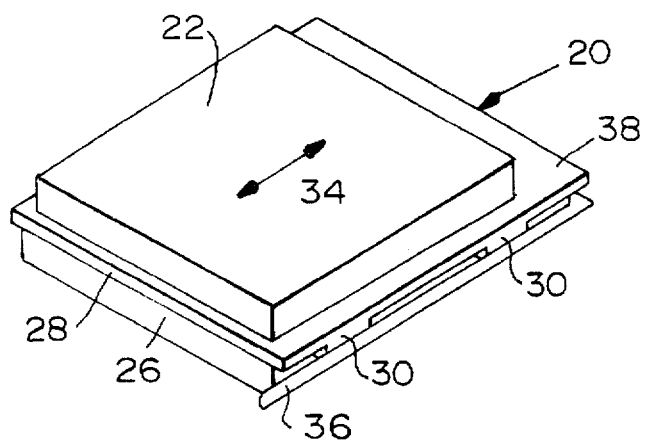
FIG. 1 is an isometric view of a PGA device mounted on an electrical connector constructed in accordance with the present invention.

Having reference now to the drawings, FIG. 1 illustrates a zero insertion force connector designated as a whole as 20 used with a PGA device 22. In a preferred arrangement the PGA device may be a microprocessor having hundreds of pin terminals 24 (FIG. 3) typically in a staggered array. Connector 20 is mounted by soldering to a printed circuit board (not shown) and releasably receives the device 22 in order to make electrical connections between the pin terminals 24 and conductive areas of the printed circuit board.

In general, the zero insertion force connector 20 includes a lower housing 26 and an upper housing 28. Latch and guide structures 30 are provided on the housings 26 and 28 in order to removably secure the upper housing 28 on an upper surface 32 (FIGS. 3, 5 and 6) of the lower housing 26. The housings 26 and 28 are relatively movable in the plane of the surface 32 in the direction indicated by an arrow 34 in FIGS. 1 and 3. An operating lever 36 is rotatably supported by the lower housing 26 and engages the upper housing 28 to move it between a first free or unmated position and a second locked or fully mated position. In these respects, the housings 26 and 28 and the lever 36 may be conventional, and reference may be had to U.S. Pat. No. 4,498,725, incorporated herein by reference, for a disclosure of one conventional arrangement.

Upper housing 28 includes an upper surface 38 upon which the device 22 is mounted and a lower surface that slides across the upper surface 32 of lower housing 26 in response to manipulation of the operating lever 36. Numerous openings (not shown) extend through the upper housing 28 from the upper surface 38 and the openings are arrayed in the same pattern as the array of pin terminals 24 so that the device 22 can be placed upon the surface 38 with male pin terminals 24 extending through the openings of the upper housing 28. A further disclosure of one suitable form of upper housing 28 is found in pending U.S. Pat. Ser. No. 08/367,566 filed on Jan. 3, 1995, incorporated herein by reference.

Figure 3:
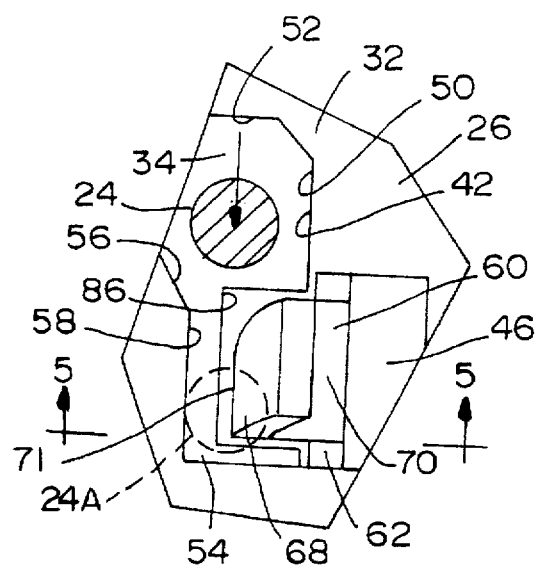
FIG. 3 is a fragmentary top plan view on an enlarged scale of part of the top surface of the lower housing of the connector of FIG. 1 with a pin terminal of the PGA device shown in section in the initial free or unmated position and shown with a broken line in the fully mated position.
Figure 5:
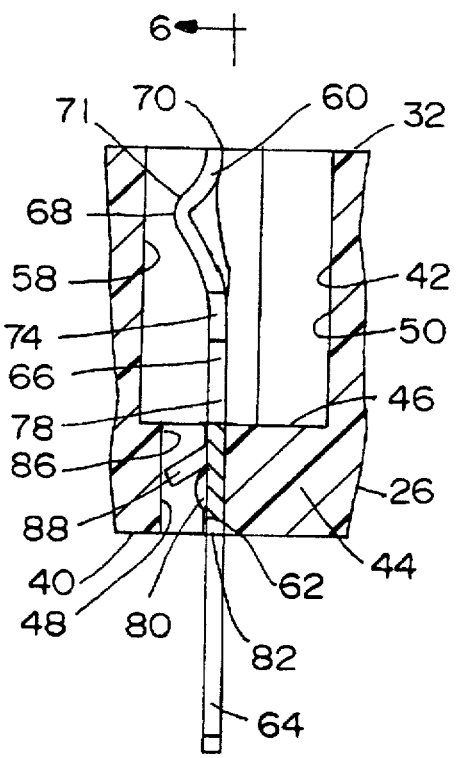
FIG. 5 is a fragmentary sectional view of the electrical connector taken along the line 5—5 of FIG. 3.
Figure 6:
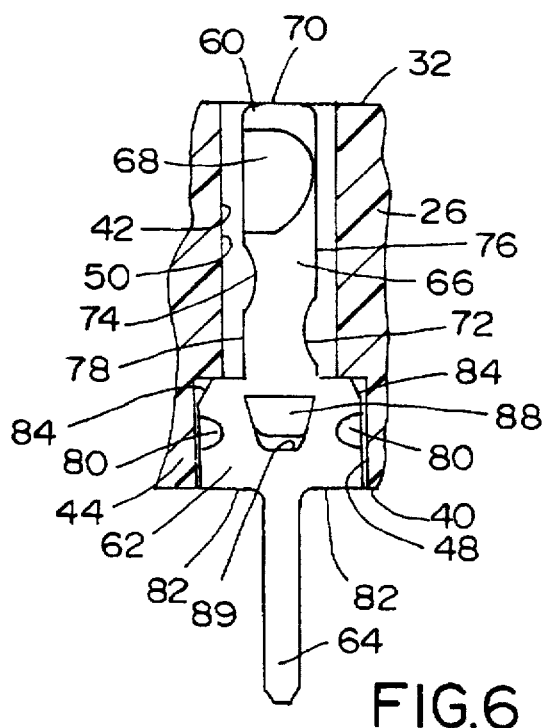
FIG. 6 is a fragmentary sectional view of the rear of the terminal within the electrical connector taken along the line 6—6 of FIG. 5.

The lower housing 26 has a lower surface 40 generally parallel to the upper surface 32. A plurality of cavities 42 extend from the upper surface 32 toward the lower surface 46. Cavities 42 correspond to the array of pin terminals 24 such that an individual cavity may be provided for each pin terminal 24 or a single cavity may receive more than one pin terminal 24. A portion of one cavity 42 is seen in FIGS. 3, 5 and 6.

The cavity 42 extends down to a base wall 44 having an upper surface 46 spaced from the lower surface 40. A generally T-shaped terminal mounting opening 48 extends through the base wall 44 between the upper and lower surfaces 46 and 40. The cavity 42 is also defined by an upstanding side wall 50 defining a pin terminal receiving region 52 and a terminal contact region 54 (FIG. 3). Side wall 50 includes a pin terminal guide ramp 56 and a pin terminal backing wall 58 (FIG. 3).

Numerous resilient terminals 60 are mounted in the lower housing 26 for contacting the pin terminals 24 of the PGA device 22. Each resilient terminal 60 includes a mounting portion 62 received in the terminal mounting opening 48 of the base wall 44. Extending downward from the mounting portion 22 is a solder tail portion 64 for connection to a plated through hole of the printed circuit board (not shown) upon which the connector 20 is mounted. Alternatively, a surface mount tail or other tail configuration could be used. Extending upward from the mounting portion 22 is a flexible and resilient spring arm portion 66 in the form of a flat and planar leaf region. A contact structure 68 is located above the spring arm portion 66 near a free end 70 of the terminal 60. The terminals 60 are small enough to permit terminals formed in a stamping and forming operation from a single sheet of flat planar sheet metal stock to be inserted at close spacings before the terminals are severed from a single carrier strip.

In the free or unmated position of the housings 26 and 28, the pin terminals 24 are initially received without a mating or insertion force in the pin terminal receiving regions 52 of the cavities 42. The initial, unmated pin terminal position is seen in solid lines in FIG. 3. When the lever 36 is used to move the housings to the fully mated position, each pin terminal 24 moves in the direction of the arrow 34 in FIG. 3 relative to the lower housing 26 into the terminal contact region 54 of the cavity 48. The fully mated position of the pin terminal in cavity 42 is seen as 24A in broken lines in FIG. 3. The guide ramp 56 and backing wall 58 guide the pin terminal 24 into the fully mated position.

The contact structure 68 is formed to project above or out of the plane of the metal stock from which the terminal 60 is made. As the pin terminal 24 moves relative to the resilient terminal 60 in the direction of the arrow 34 in FIG. 3, it engages a raised pin engagement surface 71 of the contact structure 68 and the spring arm portion 66 resiliently flexes to apply a contact mating force to the contact interface as the contact structure 68 moves away from the wall 58 in a direction perpendicular to the direction of the arrow 34. The contact structure 68 is preferably as described in pending U.S. Pat. Ser. No. 08/367,566 filed on Jan. 3, 1995, and reference may be had to that application for a further description of the structure, operation and advantages of the contact structure 68.

Because PGA devices such as microprocessors operate at increasingly higher frequencies, it is important to reduce the impedance of associated electrical connectors. The physical size of the resilient terminal 60 affects the high speed electrical performance. Increased length of the spring portion 66 increases inductance. Decreases in cross sectional area of spring portion 66 can also degrade high frequency electrical performance. It is desirable to decrease the spring length to reduce inductance while minimizing reduction of cross sectional area, and to maintain a desired predetermined normal resilient contact force of the mated contacts without a substantial increase in the cam forces incurred as the mating contacts engage and move relative to one another.

Figure 2:
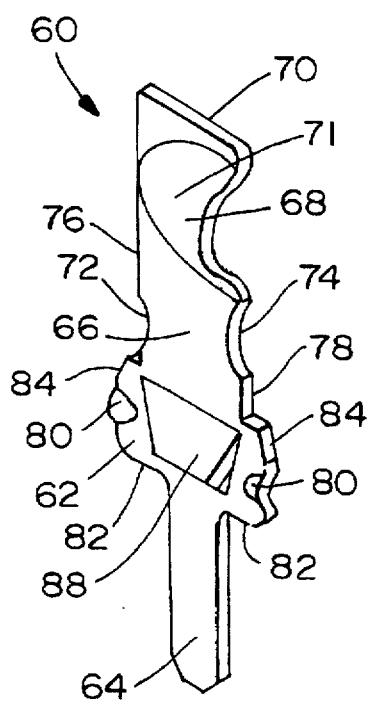
FIG. 2 is an isometric view on an enlarged scale of a resilient electrical terminal of the connector of FIG. 1.

The spring arm portion 66 includes a pair of arc-shaped notches or indentations 72 and 74 in opposed side edges 76 and 78 of the spring portion 66 as best seen in FIGS. 2 and 6. The center of the radius of each arc is located outside the side edges 76, 78 of the terminals 60. The side edge 76 is located at the side of the terminal 60 where the pin engagement surface 71 is initially contacted by the pin terminal 24, and the opposite side edge 78 is adjacent the fully mated contact interface location. Notches 72 and 74 are not vertically aligned with one another but rather are offset from one another along the length of the spring portion 66. The notch 74 is relatively closer to the contact structure 68 and the notch 72 is relatively closer to the mounting portion 62.

This notch configuration has important advantages. The spring portion 66 is made relatively short, thereby minimizing inductance. The notches 72 and 74 increase the flexibility of the spring portion 66 so that excessive normal mating forces are avoided even though the spring length is decreased. Because the notches 72 and 74 are not aligned, they do not result in a narrow neck region that would have electrical and mechanical disadvantages including increased impedance, concentration of mechanical stress and susceptibility to plastic deformation. Furthermore, the notches are preferably arc-shaped in order to reduce stress concentrations in the beam.

The offset notches 72 and 74 impart a somewhat diagonal or slightly S shaped configuration to the spring portion 66. This has the beneficial effect of making the spring portion 66 act as a relatively short member electrically but as a relatively longer beam member mechanically. Spring portion 66 serves primarily as a cantilever leaf spring, flexing in the direction perpendicular to the contact mating direction of arrow 34. However, the notch 74 adjacent to the contact structure 68 and underlying the region where the pin terminal 24 first contacts the contact structure permits a limited and transitory torsional deflection, increasing flexibility as contact is initiated near the side edge 76. The contact structure is permitted to rotate slightly as contact is made. Then as the fully mated position is approached closer to the side edge 78 of the contact region, the contact structure rotates back. In the fully mated position, substantially pure cantilever flexing occurs with no significant torsional deflection.

A further advantage of the connector 20 is that the resilient terminals 60 are loaded into the lower housing 26 from beneath the base wall 44. In connectors of the same type where the terminals are loaded from above, the terminal insertion tooling may apply some of the terminal mounting force to the free end of the terminal because there is not sufficient room within the terminal receiving cavity for the tooling. Forces applied to the free end of the terminal can damage the contact structure or the spring arm portion.

The mounting portion 62 of the terminal 60 is generally a flat, planar element in the plane of the stock of the metal from which the terminal 60 is made. A pair of positioning feet 80 are formed on the portion 62 for increasing the force with which the terminal is retained and for accurately locating the terminal in the cavity 42. Mounting portion 62 is pressed with a frictional, interference fit into a correspondingly shaped portion of the terminal mounting opening 48. Once positioned within terminal mounting opening 48, the lateral edges of the mounting portion 62 engage end walls of the opening 48 and feet 80 and the surface of mounting portion 62 opposite feet 80 engage the sidewalls of mounting portion 62 in order to securely hold the terminals on all sides.

The mounting portion 62 of the terminal 60 has downwardly facing shoulders 82 that can be directly engaged by tooling for forcing the mounting portion 62 upward into the terminal mounting opening 48. Sloped entry surfaces 84 are formed on the upper corners of the mating portion 62 to guide and facilitate movement of the portion 62 into the opening 48.

Because the resilient terminal 60 is installed from below, the contact structure 68 must pass through the terminal mounting opening 48. Contact structure 68 projects above or out of the plane of the sheet metal stock from which the terminal 60 is made. To provide clearance, the terminal receiving opening 48 has an enlarged portion 86 seen in FIGS. 3–5.

Figure 4:
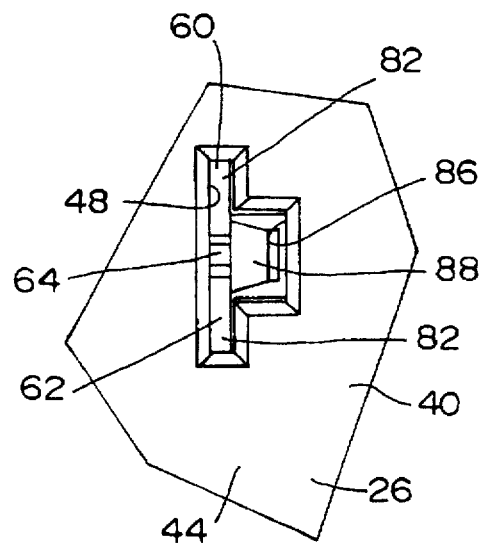
FIG. 4 is a fragmentary bottom plan view of part of the bottom surface of the lower housing illustrating a terminal and a terminal retention opening.

As such, it can be seen in FIG. 4 that the terminal receiving cavity 48 is generally T-shaped. The base or stem of the T-shape is slightly longer than the distance the contact structure 68 projects out of or above the plane of the sheet metal stock from which it is formed in order to permit the contact structure to pass through the cavity 48. As stated above, the cross member of the T-shape receives mounting portion 62 of the terminal in an interference fit. As a result, the cross member of the T-shape is slightly smaller than the mounting portion 62.

When the pin contact portion 64 of the terminal 60 is soldered to a printed circuit board, molten solder can flow or wick upward along the metal surfaces of the terminal. The enlarged portion 86 of the terminal receiving opening 48 could provide a path for the flow of solder through the base wall 44 and into the cavity 42. To prevent such solder wicking, a projection 88 is formed on the mounting portion 62 of the terminal 60. As best seen in FIGS. 4 and 5, the projection 88 is approximately at least as large as the contact structure 68 and substantially blocks or fills the enlarged portion 86 leaving only clearances too small for the flow of solder. The projection 88 is formed as a tab struck from the mounting portion 62, but other configurations of projection could be used. By striking the projection 88 from mounting portion 62, a hole is created in mounting portion 62. As the terminals are soldered to a printed circuit board, if solder attempts to wick up the terminal, the solder will attempt to fill the opening 89 created when projection 88 was formed rather than continuing up the terminal 60 into the contact structure 68.

While the present invention has been described with reference to the details of the embodiment of the invention shown in the drawing, these details are not intended to limit the scope of the invention as claimed in the appended claims.

We claim:

1. A zero insertion force electrical connector for use with a device having an array of pin terminals, said electrical connector comprising:

a dielectric housing having a bottom and including a lower component and an upper component slidably mounted thereon, said lower component having a top surface and a plurality of cavities in said top surface corresponding to the array of pin terminals;

each of said cavities including a base wall spaced from said top surface;

terminal retention openings in said base wall;

a plurality of terminals in said cavities, each of said terminals being a stamped and formed segment of flat and planar metal stock and including a mounting portion substantially in the plane of said stock, a free end portion, a contact structure adjacent said free end portion and a spring portion between said mounting portion and said contact structure; and means for moving said pin terminals in said cavities between an unmated position wherein the pins are spaced from said contact structures in said cavities and a mated position wherein the pins are mated with said contact structures;

said terminal mounting portion being received in one of said terminal retention openings for securing said terminal in said cavity;

said contact structure including a pin engagement surface raised from the plane of said stock;

said terminal retention opening having an enlarged portion permitting entry of said contact structure into said cavity through said base wall in order to facilitate loading said terminal from said bottom of said housing; and said mounting portion having raised profiles above the plane of the stock for retaining said mounting portion in said terminal retention opening, a cantilevered projection extending out of the plane of said stock and substantially blocking said enlarged portion when said mounting portion and said cantilevered projection are received in said terminal retention opening in order to prevent wicking of solder through said terminal retention opening, and said mounting portion including an opening located generally centrally therein.

2. A zero insertion force electrical connector as claimed in claim 1, said projection comprising a tab struck from said mounting portion.

3. A zero insertion force electrical connector as claimed in claim 1, wherein said terminal retention opening is generally T-shaped having a stem and a cross member, said stem being slightly longer than the height of said raised pin engagement surface above said plane of said stock and said cross member being slightly smaller than said mounting portion to create an interference fit between said cross member and said mounting portion to retain said terminal in said housing.

4. A zero insertion force electrical connector for interconnecting to a mating component, said electrical connector comprising:

a dielectric housing having top surface, a bottom surface and a plurality of cavities therebetween;

each of said cavities including T-shaped terminal retention openings in said bottom surface;

a plurality of terminals in said cavities, each of said terminals being a stamped and formed segment of flat and planar metal stock and including a tail portion, a mounting portion substantially in the plane of said stock having projections extending above the plane of said stock for engaging with one of said T-shaped retention opening, a free end portion, a contact structure adjacent said free end portion and a spring portion between said mounting portion and said contact structure; and said terminal mounting portion being received in one of said terminal retention openings for securing said terminal in said cavity;

said contact structure including an engagement surface raised from the plane of said stock;

said terminal retention opening having an enlarged portion permitting entry of said contact structure into said cavity through said base wall in order to facilitate loading said terminal into said bottom surface of said housing; and anti-solder wicking means for preventing solder from wicking up said terminal from said tail portion past said mounting portion and onto said contact structure, wherein said anti-solder wicking means is a projection extending out of the plane of said stock and substantially blocking said enlarged portion when said mounting portion is received in said terminal retention opening.

5. A zero insertion force electrical connector as claimed in claim 4, said projection comprising a tab struck from said mounting portion.

6. A zero insertion force electrical connector as claimed in claim 4, wherein each of said T-shaped terminal retention openings has a stem and a cross member, said stem being slightly longer than the height of said raised pin engagement surface above said plane of said stock and said cross member being slightly smaller than said mounting portion.

7. A zero insertion force electrical connector as claimed in claim 4, wherein said mounting portion includes an opening located generally centrally therein.

* * * * *